United States Patent
Iizuka et al.

(10) Patent No.: US 8,236,106 B2
(45) Date of Patent: Aug. 7, 2012

(54) SHOWER HEAD AND SUBSTRATE PROCESSING APPARATUS

(75) Inventors: Hachishiro Iizuka, Nirasaki (JP); Fumiko Kiriishi, Nirasaki (JP); Tsuyoshi Komiyama, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 524 days.

(21) Appl. No.: 12/403,722

(22) Filed: Mar. 13, 2009

(65) Prior Publication Data

US 2009/0229754 A1 Sep. 17, 2009

Related U.S. Application Data

(60) Provisional application No. 61/050,757, filed on May 6, 2008.

(30) Foreign Application Priority Data

Mar. 14, 2008 (JP) ................. 2008-065352

(51) Int. Cl.
- *C23C 16/455* (2006.01)
- *C23F 1/00* (2006.01)
- *H01L 21/306* (2006.01)
- *C23C 16/06* (2006.01)
- *C23C 16/22* (2006.01)

(52) U.S. Cl. ..... 118/715; 118/728; 118/50; 156/345.33; 156/345.34; 156/345.35; 156/345.36; 156/345.26; 156/345.51

(58) Field of Classification Search .................. 118/715, 118/728, 50; 156/345.29, 345.33, 345.34, 156/345.35, 345.36

See application file for complete search history.

(56) References Cited

U.S. PATENT DOCUMENTS

| | | | | |
|---|---|---|---|---|
| 4,590,042 | A * | 5/1986 | Drage | 422/186.06 |
| 5,453,124 | A * | 9/1995 | Moslehi et al. | 118/715 |
| 5,582,866 | A | 12/1996 | White | |
| 5,728,224 | A * | 3/1998 | Laurent et al. | 118/718 |
| 6,125,788 | A * | 10/2000 | Hills et al. | 156/345.51 |
| 6,432,831 | B2 * | 8/2002 | Dhindsa et al. | 438/710 |
| 6,537,418 | B1 * | 3/2003 | Muller et al. | 156/345.34 |

(Continued)

FOREIGN PATENT DOCUMENTS

JP 2662365 6/1997

(Continued)

OTHER PUBLICATIONS

Office Action issued Jan. 11, 2011, in Korean Patent Application No. 10-2009-0021431 (with English-language Translation).

*Primary Examiner* — Rudy Zervigon
(74) *Attorney, Agent, or Firm* — Oblon, Spivak, McClelland, Maier & Neustadt, L.L.P.

(57) ABSTRACT

A shower head is provided in a processing chamber for processing a substrate therein. Further, the shower head has a facing surface facing a mounting table for mounting thereon the substrate and serves to supply one or more gases through the facing surface toward the substrate. The shower head includes a central gas supply unit for supplying a first gas through a central portion of the facing surface toward the substrate, a peripheral gas supply unit for supplying a second gas through a peripheral portion of the facing surface toward the substrate and a gas exhaust unit, provided with a plurality of gas exhaust holes formed between the central gas supply unit and the peripheral gas supply unit, for exhausting the first and the second gas from the facing surface.

20 Claims, 5 Drawing Sheets

U.S. PATENT DOCUMENTS

| | | | |
|---|---|---|---|
| 6,800,139 B1* | 10/2004 | Shinriki et al. | 118/715 |
| 6,821,910 B2* | 11/2004 | Adomaitis et al. | 438/758 |
| 7,273,526 B2* | 9/2007 | Shinriki et al. | 118/715 |
| 7,371,332 B2* | 5/2008 | Larson et al. | 216/58 |
| 7,572,337 B2* | 8/2009 | Rocha-Alvarez et al. | 118/715 |
| 7,718,030 B2* | 5/2010 | Funk et al. | 156/345.29 |
| 7,789,961 B2* | 9/2010 | Nelson et al. | 118/715 |
| 8,038,834 B2* | 10/2011 | Funk et al. | 156/345.29 |
| 8,133,323 B2* | 3/2012 | Kakegawa | 118/724 |
| 2002/0160125 A1* | 10/2002 | Johnson et al. | 427/569 |
| 2005/0208217 A1 | 9/2005 | Shinriki et al. | |
| 2005/0229848 A1* | 10/2005 | Shinriki et al. | 118/715 |
| 2006/0234514 A1* | 10/2006 | Gianoulakis et al. | 438/758 |
| 2007/0026540 A1* | 2/2007 | Nooten et al. | 438/5 |
| 2007/0068625 A1* | 3/2007 | Funk et al. | 156/345.29 |
| 2010/0193471 A1* | 8/2010 | Funk et al. | 216/67 |

FOREIGN PATENT DOCUMENTS

| | | |
|---|---|---|
| JP | 11-144891 | 5/1999 |
| JP | 2004-339566 | 12/2004 |
| JP | 2005-113268 | 4/2005 |
| JP | 2005-303292 | 10/2005 |
| JP | 2006-19552 | 1/2006 |
| JP | 2006-165173 | 6/2006 |

* cited by examiner

SHOWER HEAD AND SUBSTRATE PROCESSING APPARATUS

FIELD OF THE INVENTION

The present invention relates to a shower head and a substrate processing apparatus which are used in a plasma processing of a substrate or the like.

BACKGROUND OF THE INVENTION

Conventionally, in, e.g., a manufacturing process of a semiconductor device, a substrate processing apparatus for processing a substrate while supplying a gas in a shower shape through a shower head disposed to face a substrate has been used as a processing apparatus for processing a substrate such as a semiconductor wafer or a glass substrate for use in a liquid crystal display or the like.

For example, in a plasma processing apparatus for performing plasma processing such as an etching process or a film forming process on a substrate disposed in a processing chamber by using a plasma generated from a processing gas in the processing chamber, the shower head also serves as an electrode facing a mounting table for mounting thereon the substrate. Further, a predetermined processing gas supplied in a shower shape through the shower head is discharged through a periphery of the mounting table (substrate) toward a lower portion of the processing chamber. Furthermore, a plasma of the processing gas is generated by a high frequency power applied to a space between the shower head and the mounting table.

Further, there is known a plasma processing apparatus in which a gas is discharged through the periphery of the shower head toward an upper portion of the processing chamber (see, e.g., Japanese Patent Publication No. 2662365). Besides, there is also known a CVD apparatus in which a gas is discharged at a central portion of the shower head (see, e.g., Japanese Patent Laid-open Application No. 2004-339566).

In the above prior arts, the gas is arranged to be discharged at the periphery of the mounting table (substrate) toward the lower portion of the processing chamber or at the periphery of the shower head toward the upper portion of the processing chamber. Accordingly, the gas supplied through the shower head flows from a central portion to a peripheral portion of the substrate, thereby making a processing state at the central portion of the substrate different from that at the peripheral portion of the substrate, resulting in deteriorating in-plane uniformity of the processing. Further, in the prior art in which the gas is discharged at the central portion of the shower head, the gas supplied through the shower head flows from the peripheral portion to the central portion of the substrate. As a consequence, a processing state at the central portion of the substrate is different from that at the peripheral portion of the substrate, thereby deteriorating the in-plane uniformity of the processing deteriorates. Moreover, the deterioration of the in-plane processing uniformity markedly increases as a substrate to be processed, e.g., a semiconductor wafer or the like, is scaled up.

SUMMARY OF THE INVENTION

In view of the above, the present invention provides a shower head and a substrate processing apparatus, which can improve uniformity of processing compared to prior arts.

In accordance with an aspect of the present invention, there is provided a shower head provided in a processing chamber for processing a substrate therein, the shower head having a facing surface facing a mounting table for mounting thereon the substrate and serving to supply one or more gases through the facing surface toward the substrate, the shower head including: a central gas supply unit for supplying a first gas through a central portion of the facing surface toward the substrate; a peripheral gas supply unit for supplying a second gas through a peripheral portion of the facing surface toward the substrate; and a gas exhaust unit, provided with a plurality of gas exhaust holes formed between the central gas supply unit and the peripheral gas supply unit, for exhausting the first and the second gas through the facing surface.

The shower head may have a facing electrode facing the mounting table.

The first gas may be identical to the second gas.

In accordance with an another aspect of the present invention, there is provided a substrate processing apparatus including: a processing chamber for processing a substrate therein; a mounting table provided in the processing chamber for mounting thereon the substrate; and a shower head having a facing surface facing the mounting table and serving to supply one or more gases through the facing surface to the substrate, wherein the shower head includes: a central gas supply unit for supplying a first gas through a central portion of the facing surface toward the substrate; a peripheral gas supply unit for supplying a second gas through a peripheral portion of the facing surface toward the substrate; and a gas exhaust unit, provided with a plurality of gas exhaust holes formed between the central gas supply unit and the peripheral gas supply unit, for exhausting the first and the second gas through the facing surface.

The shower head may have a facing electrode facing the mounting table.

The first gas may be identical to the second gas.

A high frequency power may be applied between the shower head and the mounting table to generate a plasma, and the substrate may be processed by using the plasma.

The substrate may be etched by the plasma.

The present invention can provide a shower head and a substrate processing apparatus, which can improve uniformity of processing compared to prior arts.

BRIEF DESCRIPTION OF THE DRAWINGS

The objects and features of the present invention will become apparent from the following description of embodiments, given in conjunction with the accompanying drawings, in which.

DETAILED DESCRIPTION OF EMBODIMENT

Figure 1:
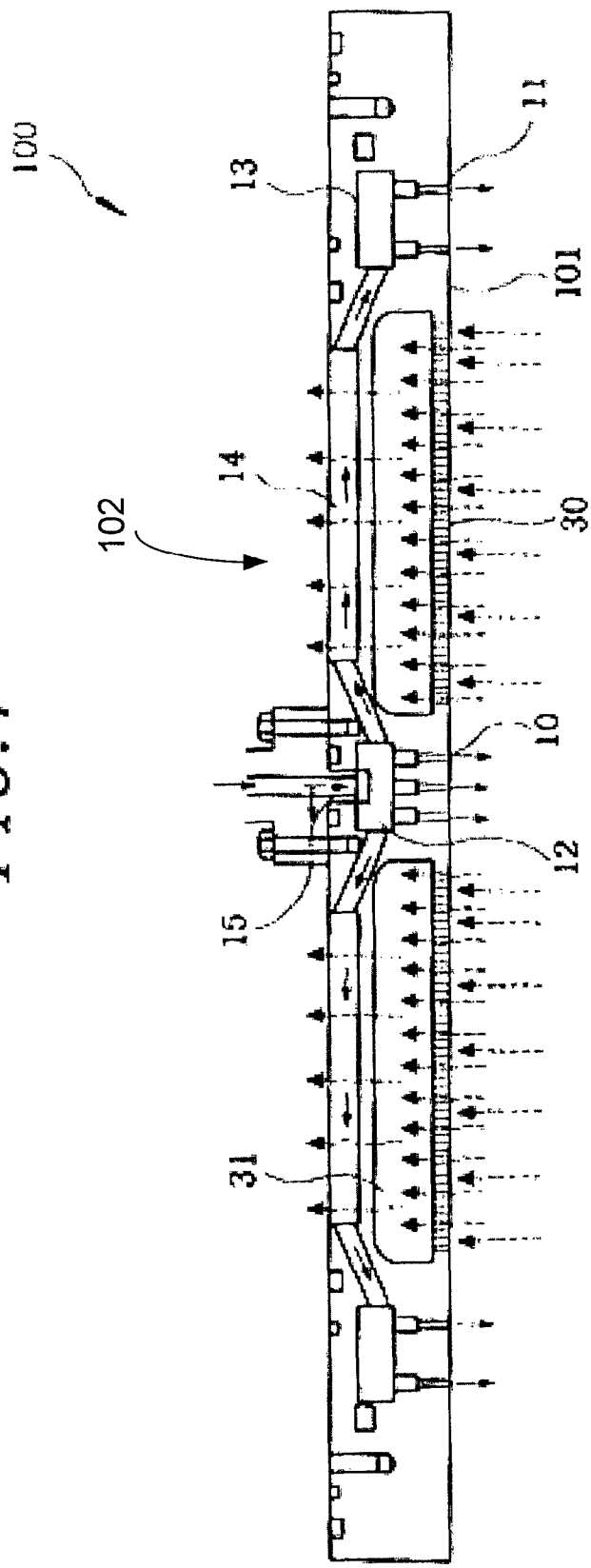
FIG. 1 shows a configuration of a shower head in accordance with an embodiment of the present invention.
Figure 2:
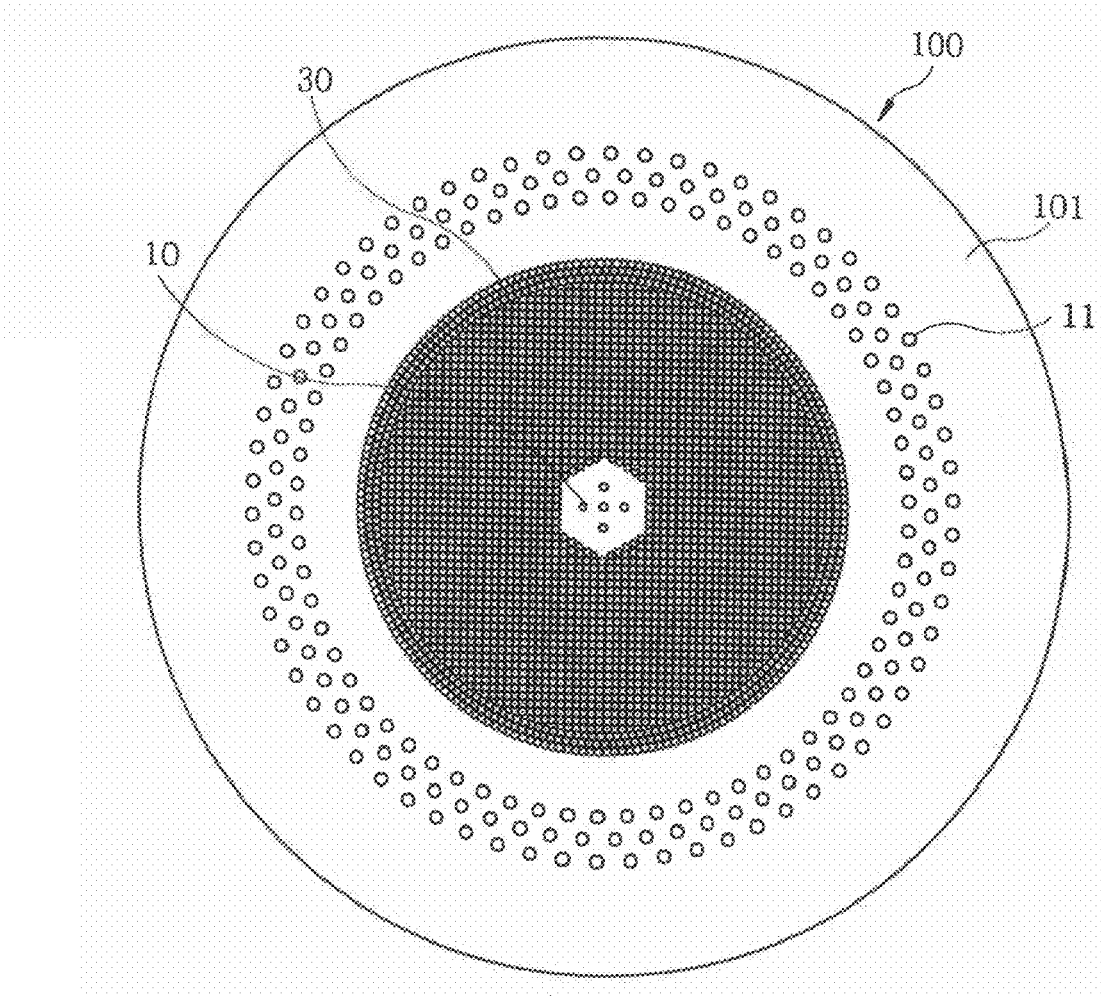
FIG. 2 describes a bottom view of the shower head of FIG. 1.

Embodiment of the present invention will be described with reference to the accompanying drawings which form a part hereof. FIGS. 1 and 2 show configurations of a shower head in accordance with an embodiment of the present invention, wherein FIG. 1 schematically illustrates a cross sectional configuration of a shower head 100, and FIG. 2 schematically depicts an outer appearance configuration of a bottom surface 101 of the shower head 100. Further, the bottom surface 101 of the shower head 100 shown in FIG. 2 forms a surface facing a mounting table for mounting thereon a substrate, as will be described later.

The shower head 100 is made of a conductive material, e.g., aluminum having an anodically oxidized surface, and is formed in a plate shape (a circular plate shape in the present embodiment). As illustrated in FIG. 2, a plurality of central gas injection openings 10 for supplying a processing gas is formed at a central portion of the shower head 100. Further, a plurality of peripheral gas injection openings 11 is formed at a peripheral portion of the shower head 100, as shown in FIG. 2. Furthermore, a plurality of gas exhaust holes 30 is formed at a region between the central gas injection openings 10 and the peripheral gas injection openings 11. The diameter of each of the gas exhaust holes 30 is, e.g., about 3 mm, so that the number of the gas exhaust holes 30 in the shower head 100 for processing a semiconductor wafer having a diameter of about 10 inches is about 2800.

As depicted in FIG. 1, a central gas diffusion space 12 directly facing the central gas injection openings 10 is formed at the central portion of the shower head 100, and a peripheral gas diffusion space 13 directly facing the peripheral gas injection openings 11 is formed in a ring shape at the peripheral portion of the shower head 100. Further, the central gas diffusion space 12 and the peripheral gas diffusion space 13 communicate with each other through a plurality of (e.g., four) gas channels 14 formed radially from the central portion of the shower head 100 toward the peripheral portion of the shower head 100.

Besides, a gas inlet portion 15 is connected to the central gas diffusion space 12. As indicated by arrows in FIG. 1, a part of the processing gas supplied through the gas inlet portion 15 to the central gas diffusion space 12 is discharged from the central gas injection openings 10, while the other part of the processing gas is guided to the peripheral gas diffusion space 13 via the gas channels 14 to be discharged from the peripheral gas injection openings 11. In the present embodiment, there is employed a configuration in which the processing gas is guided from the central gas diffusion space 12 to the peripheral gas diffusion space 13 via the gas channels 14 by providing the gas inlet portion 15 only at the central gas diffusion space 12. However, it is also possible to employ a configuration in which processing gases are independently introduced into the central gas diffusion space 12 and the peripheral gas diffusion space 13 by providing separate gas supply units thereto, respectively. With such configuration, a gas injection state from the central gas injection openings 10 and a gas injection state from the peripheral gas injection openings 11 can be independently controlled and, also, different gases can be discharged therefrom.

Moreover, a gas exhaust space 31 communicating with the gas exhaust holes 30 is provided at a region between the central gas diffusion space 12 and the peripheral gas diffusion space 13 in the shower head 100. The gas is discharged from the gas exhaust holes 30 via the gas exhaust space 31, as indicated by arrows in FIG. 1.

As set forth above, the shower head 100 includes a peripheral gas supply unit for supplying a gas through the peripheral gas injection openings 11 provided at the peripheral portion of the bottom surface (the surface facing the substrate) 101, a central gas supply unit for supplying a gas through the central gas injection openings 10 provided at the central portion and a gas exhaust unit 102 for exhausting the gas through the gas exhaust holes 30 formed between the peripheral gas supply unit and the central gas supply unit.

Figure 3:
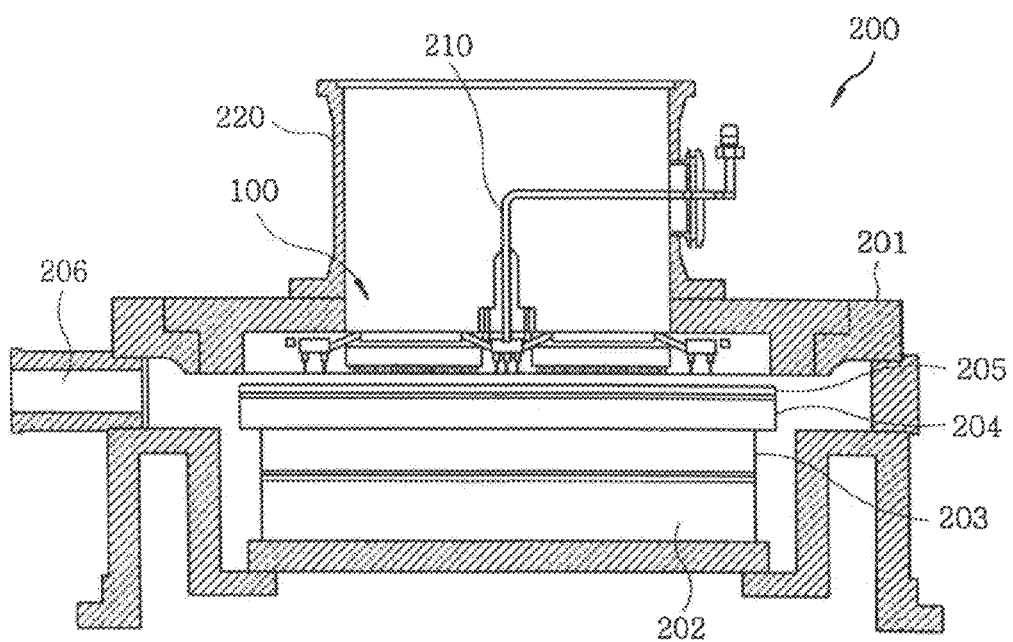
FIG. 3 illustrates a configuration of a plasma etching apparatus in accordance with an embodiment of the present invention.

FIG. 3 shows a configuration of a plasma etching apparatus 200 as a substrate processing apparatus having the shower head 100. The plasma etching apparatus 200 is configured as a capacitively coupled parallel plate type plasma etching apparatus including an upper and a lower electrode plate disposed to face each other in parallel and connected to a power supply for plasma generation.

The plasma etching apparatus 200 has a cylindrical processing chamber (processing vessel) 201 made of, e.g., aluminum whose surface is anodically oxidized, wherein the processing chamber 201 is grounded. A substantially columnar susceptor support 203 is installed at a bottom portion of the processing chamber 201 via an insulating plate 202 such as ceramic or the like. Further, a susceptor (mounting table) 204 which mounts thereon a semiconductor wafer as a substrate to be processed and serves as a lower electrode is mounted on the susceptor support 203. The susceptor 204 is connected to a high frequency power application unit (not shown) such as a high frequency power supply or the like.

Disposed on an upper portion of the susceptor 204 is an electrostatic chuck 205 for electrostatically attracting and holding the semiconductor wafer. The electrostatic chuck 205 includes an electrode embedded in insulating materials. The semiconductor wafer is electrostatically attracted and held by a Coulomb force generated by a DC voltage applied to the electrode.

The susceptor 204 is provided with a cooling mechanism (not shown), so that the temperature of the semiconductor wafer electrostatically attracted and held on the electrostatic chuck 205 can be adjusted to be maintained at a predetermined level. Formed on the side wall portion of the processing chamber 201 are an opening 206 for loading and unloading the semiconductor wafer into and from the processing chamber 201 and an opening/closing mechanism (gate valve) (not shown) for airtightly sealing the opening 206.

The shower head 100 shown in FIG. 1 is disposed above the susceptor 204 so as to face the susceptor 204 at a specific distance therefrom. Further, the shower head 100 serving as the upper electrode and the susceptor 204 serving as the lower electrode form a pair of facing electrodes.

A gas supply line 210 is connected to the gas inlet portion 15 of the shower head 100. A predetermined processing gas (etching gas) is supplied from a gas supply mechanism (not shown) to the gas supply line 210.

Further, a gas exhaust unit 220 is provided at an upper portion of the shower head 100, and is connected to a gas exhaust unit having a vacuum pump such as a turbo molecular pump or the like via a filter unit (not shown). Moreover, the filter unit allows a gas to be discharged toward an upper portion of a processing space of the processing chamber 201 (a space between the shower head 100 and the susceptor 204). Accordingly, particles or the like that have been generated in the processing space of the processing chamber 201 and introduced into the gas exhaust unit 220 are prevented from backwardly flowing into the processing space of the processing chamber 201 and from entering the gas exhaust unit such as a vacuum pump or the like.

In order to perform a plasma etching on a semiconductor wafer by using the plasma etching apparatus 200 configured as described above, first, the semiconductor wafer is loaded into the processing chamber 201 through the opening 206, and is mounted on the electrostatic chuck 205. Next, the semiconductor wafer is electrostatically attracted and held on the electrostatic chuck 205. Thereafter, the opening 206 is closed, and the inner space of the processing chamber 201 is vacuum exhausted to be maintained at a predetermined vacuum level by the gas exhaust unit.

Then, a predetermined processing gas (etching gas) is supplied at a predetermined flow rate through the gas supply line 210 to the gas inlet portion 15 of the shower head 100. Next, the processing gas is supplied in a shower shape through the central gas injection openings 10 and the peripheral gas injection openings 11 to the semiconductor wafer W on the susceptor 204.

Thereafter, the pressure in the processing chamber 201 is maintained at a predetermined level and, then, a high frequency power of a predetermined frequency, e.g., 13.56 MHz, is applied to the susceptor 204. Accordingly, a high frequency electric field is generated between the shower head 100 serving as the upper electrode and the susceptor 204 serving as the lower electrode. As a consequence, the etching gas is dissociated and converted into a plasma, and the predetermined etching process is performed on the semiconductor wafer by the plasma thus generated.

In the above-described etching process, the processing gas supplied in a shower shape through the central gas injection openings 10 of the shower head 100 is exhausted through the gas exhaust holes 30 while being diffused toward the peripheral portion. Further, the processing gas supplied in a shower shape through the peripheral gas injection openings 11 of the shower head 100 is exhausted through the gas exhaust holes 30 while being diffused toward the central portion. Since the processing gas flows in both directions along the diametrical direction of the semiconductor wafer, the processing gas can be more uniformly supplied to the semiconductor wafer and, also, the etching process can be more uniformly performed in the respective portions of the semiconductor wafer, compared to the case when the processing gas flows in one direction from the central portion to the peripheral portion of the semiconductor wafer or from the central portion to the peripheral portion of the semiconductor wafer. That is, the in-plane uniformity of the processing can be improved.

Upon the completion of the predetermined plasma etching process, the supply of the high frequency power and the supply of the processing gas are stopped, and the semiconductor wafer is unloaded from the processing chamber 201 in a reverse sequence of the steps described above.

Figure 4:
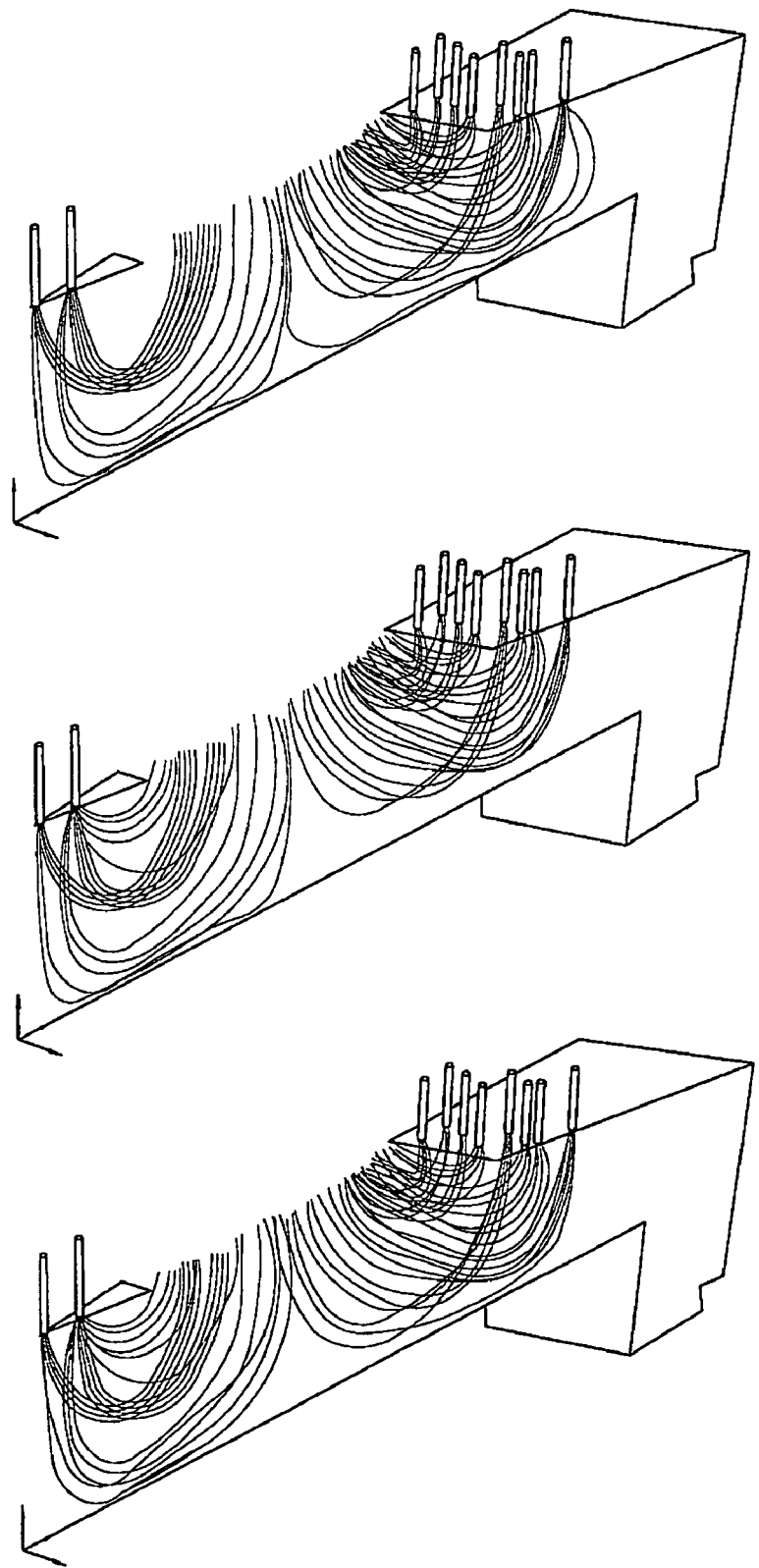
FIG. 4 presents a simulation image showing a result of simulation of a gas flow in the plasma etching apparatus of the embodiment of the present invention.
Figure 5:
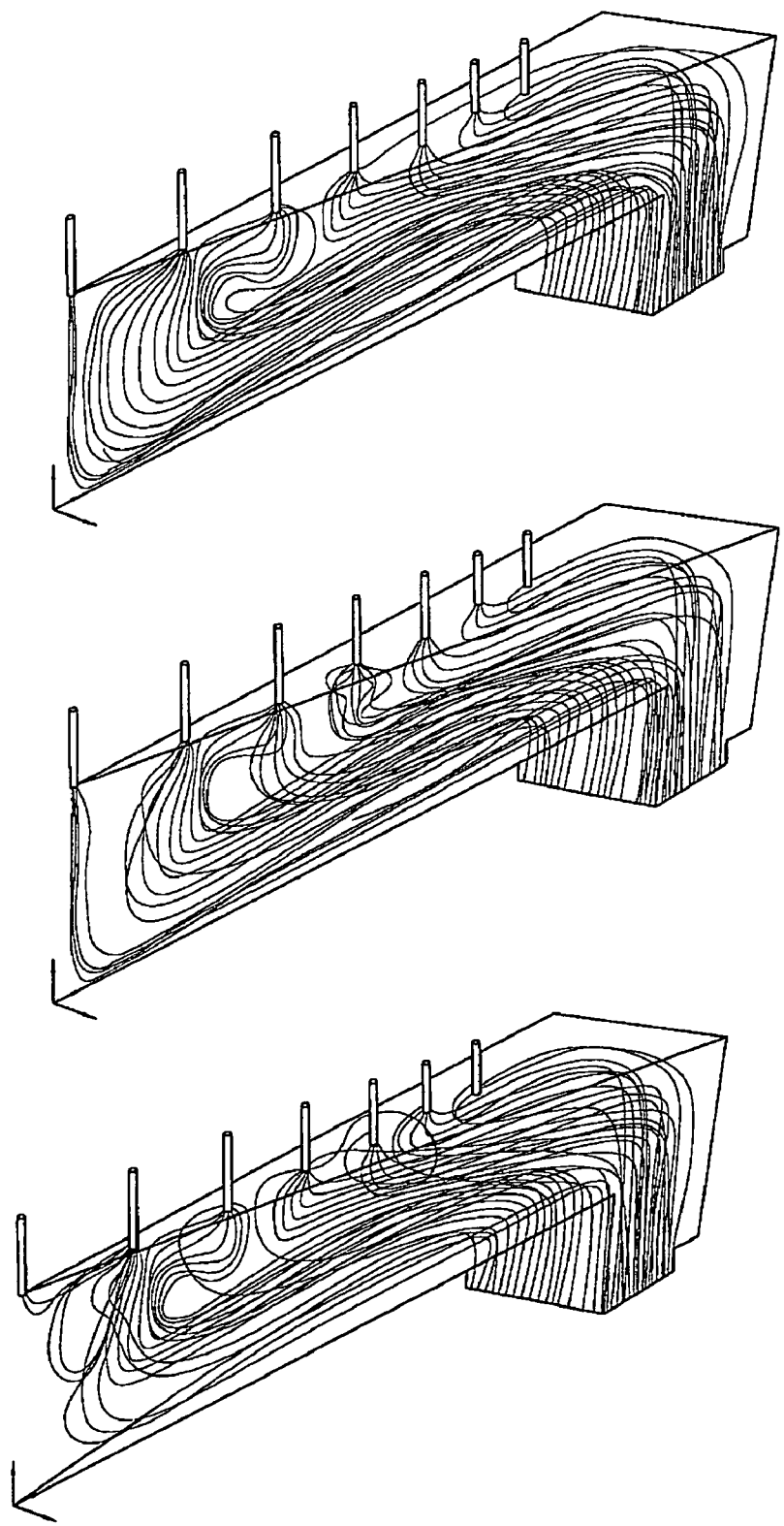
FIG. 5 represents a simulation image depicting a result of simulation of a gas flow in a conventional plasma etching apparatus.

FIG. 4 shows a simulation result of a gas flow in the plasma etching apparatus 200 configured as described above. For comparison, FIG. 5 illustrates a simulation result of a gas flow in a conventional plasma etching apparatus in which a gas is discharged at a lower portion of a processing chamber. In a simulation model for FIG. 4, a sector shape (θ=10°) was employed, and the number of gas holes was set to realize the present embodiment, while an opening ratio and a conductance of the gas exhaust holes were obtained on the assumption that the gas exhaust holes are arranged on a plane. In each of FIGS. 4 and 5, an upper image shows a case where the gas flow rate was about 100 sccm; an intermediate image shows a case where the gas flow rate was about 500 sccm; and a lower image shows a case where the gas flow rate was about 1000 sccm. Moreover, the gas was discharged at a specified rate with respect to the surface area. A pressure was about 4.0 Pa (30 mTorr), and a temperature was about 60° C.

As can be seen from FIG. 4, in the plasma etching apparatus of the present embodiment, the gas flow at each of the central and the peripheral portion shows substantially a same even when the gas flow increases. Moreover, the velocity of the gas at the central portion is substantially the same as that at the peripheral portion. Further, the gas is symmetrically exhausted through the gas exhaust holes disposed close to the gas injection holes at a surface facing the semiconductor wafer, so that the residence time of the gas at the surface of the wafer is substantially the same in the central and the peripheral portion thereof. On the other hand, in a conventional plasma etching apparatus, the gas flow at the peripheral portion is faster than that at the central portion, as illustrated in FIG. 5. Accordingly, the gas supplied to the central portion flows relatively slowly, whereas the gas supplied to the peripheral portion flows relatively fast. Further, the gas flow distance at the central portion of the semiconductor wafer is different from that at the peripheral portion of the semiconductor wafer, so that the residence time at the wafer surface for the central portion becomes different from that for the peripheral portion. As can be seen from the simulation result, therefore, the plasma etching apparatus 200 of the present embodiment makes it possible to perform a much more uniform processing in comparison with the conventional plasma etching apparatus.

The present invention is not limited to the above embodiment, and may be variously modified. For example, although the present invention is applied to the plasma etching apparatus in the above embodiment, the present invention may also be applied to a film forming apparatus such as a CVD apparatus or the like or to another substrate processing apparatus other than the plasma etching apparatus. Further, although the shower head is at a ground potential in the above embodiment, the present invention may be applied to an apparatus in which a high frequency power is applied to the shower head.

While the invention has been shown and described with respect to the embodiments, it will be understood by those skilled in the art that various changes and modification may be made without departing from the scope of the invention as defined in the following claims.

What is claimed is:

1. A shower head provided in a processing chamber for processing a substrate therein, the shower head having a facing surface facing a mounting table for mounting thereon the substrate and serving to supply a gas through the facing surface toward the substrate, the shower head comprising:
    a central gas supply unit for supplying the gas through the center of the facing surface toward the substrate;
    a peripheral gas supply unit for supplying the gas through a peripheral portion of the facing surface toward the substrate; and
    a gas exhaust unit, provided with a plurality of gas exhaust holes formed between the central and the peripheral gas supply unit, for exhausting the gas through the facing surface,
    wherein the central gas supply unit includes a plurality of central gas injection openings provided at the center of the facing surface to supply the gas toward the substrate, a central gas diffusion space formed in the shower head to directly face the central gas injection openings, and a gas inlet portion connected to the central gas diffusion space to supply the gas thereto,
    wherein the peripheral gas supply unit includes a plurality of peripheral gas injection openings provided at the peripheral portion of the facing surface to supply the gas toward the substrate and a peripheral gas diffusion space formed in the shower head to directly face the peripheral gas injection openings, and
    wherein a plurality of gas channels are formed radially from the center toward the peripheral portion of the shower head, so that the central gas diffusion space communicates with the peripheral gas diffusion space.

2. The shower head of claim 1, wherein the shower head is a facing electrode facing the mounting table.

3. A substrate processing apparatus comprising:
a processing chamber for processing a substrate therein;
a mounting table provided in the processing chamber for mounting thereon the substrate; and
a shower head having a facing surface facing the mounting table and serving to supply a gas in a shower head through the facing surface to the substrate,
wherein the shower head includes:
a central gas supply unit for supplying the gas through the center of the facing surface toward the substrate;
a peripheral gas supply unit for supplying the gas through a peripheral portion of the facing surface toward the substrate; and
a gas exhaust unit, provided with a plurality of gas exhaust holes formed between the central and the peripheral gas supply units, for exhausting the gas through the facing surface,
wherein the central gas supply unit includes a plurality of central gas injection openings provided at the center of the facing surface to supply the gas toward the substrate, a central gas diffusion space formed in the shower head to directly face the central gas injection openings, and a gas inlet portion connected to the central gas diffusion space to supply the gas thereto,
wherein the peripheral gas supply unit includes a plurality of peripheral gas injection openings provided at the peripheral portion of the facing surface to supply the gas toward the substrate and a peripheral gas diffusion space formed in the shower head to directly face the peripheral gas injection openings, and
wherein a plurality of gas channels are formed radially from the center toward the peripheral portion of the shower head, so that the central gas diffusion space communicates with the peripheral gas diffusion space.

4. The substrate processing apparatus of claim 3, wherein the shower head has a facing electrode facing the mounting table.

5. The substrate processing apparatus of claim 4, wherein a high frequency power is applied between the shower head and the mounting table to generate a plasma, and the substrate is processed by using the plasma.

6. The substrate processing apparatus of claim 5, wherein the substrate is etched by the plasma.

7. The shower head of claim 1, wherein the peripheral gas injection openings have a ring shape.

8. The substrate processing apparatus of claim 3, wherein the peripheral gas injection openings have a ring shape.

9. The shower head of claim 1, wherein each of the gas channels consists of a first gas channel exit area free of exhaust holes at the central gas injection openings and a second gas channel exit area free of exhaust holes at the peripheral gas injection openings.

10. The substrate processing apparatus of claim 3, wherein each of the gas channels consists of a first gas channel exit area free of exhaust holes at the central gas injection openings and a second gas channel exit area free of exhaust holes at the peripheral gas injection openings.

11. The shower head of claim 1, wherein the central gas injection openings are radially surrounded by a circle consisting of gas exhaust holes, and wherein the circle consisting of gas exhaust holes is radially surrounded by a ring consisting of peripheral gas injection openings.

12. The substrate processing apparatus of claim 3, wherein the central gas injection openings are radially surrounded by a circle consisting of gas exhaust holes, and wherein the circle consisting of gas exhaust holes is radially surrounded by a ring consisting of peripheral gas injection openings.

13. The shower head of claim 11, wherein the ring consisting of peripheral gas injection holes has an inner circumference and an outer circumference, and wherein the peripheral gas injection openings extend radially outward from the inner circumference to the outer circumference.

14. The substrate processing apparatus of claim 12, wherein the ring consisting of peripheral gas injection holes has an inner circumference and an outer circumference, and wherein the peripheral gas injection openings extend radially outward from the inner circumference to the outer circumference.

15. The shower head of claim 11, wherein a ring which is free of holes or openings is formed between a circumference of the circle consisting of gas exhaust holes and an inner circumference of the ring consisting of peripheral gas injection openings.

16. The substrate processing apparatus of claim 12, wherein a ring which is free of holes or openings is formed between a circumference of the circle consisting of gas exhaust holes and an inner circumference of the ring consisting of peripheral gas injection openings.

17. The shower head of claim 1, wherein the gas inlet portion is provided above the center of the facing surface to supply the gas toward the substrate.

18. The substrate processing apparatus of claim 3, wherein the gas inlet portion is provided above the center of the facing surface to supply the gas toward the substrate.

19. The shower head of claim 1, wherein the gas supplied through the gas inlet portion is guided from the central gas diffusion space to the peripheral gas diffusion space via the gas channels.

20. The substrate processing apparatus of claim 3, wherein the gas supplied through the gas inlet portion is guided from the central gas diffusion space to the peripheral gas diffusion space via the gas channels.

* * * * *